United States Patent
Jayaraman et al.

(10) Patent No.: US 11,796,990 B2
(45) Date of Patent: Oct. 24, 2023

(54) MODEL BASED MONITORING OF FAULTS IN ELECTRO-HYDRAULIC VALVES

(71) Applicant: Woodward, Inc., Fort Collins, CO (US)

(72) Inventors: Ganga P. Jayaraman, Buffalo Grove, IL (US); Ramiro Chaidez, Niles, IL (US); Tena K. Britt, Loveland, CO (US)

(73) Assignee: Woodward, Inc., Fort Collins, CO (US)

( * ) Notice: Subject to any disclaimer, the term of this patent is extended or adjusted under 35 U.S.C. 154(b) by 24 days.

(21) Appl. No.: 17/410,684

(22) Filed: Aug. 24, 2021

(65) Prior Publication Data

US 2023/0061016 A1     Mar. 2, 2023

(51) Int. Cl.
*G05B 23/02*     (2006.01)
*G01R 31/34*     (2020.01)

(52) U.S. Cl.
CPC ....... *G05B 23/0254* (2013.01); *G01R 31/343* (2013.01); *G01R 31/346* (2013.01)

(58) Field of Classification Search
CPC . G05B 23/0254; G01R 31/343; G01R 31/346
See application file for complete search history.

(56) References Cited

U.S. PATENT DOCUMENTS

| | | | |
|---|---|---|---|
| 4,355,358 A * | 10/1982 | Clelford | G05D 1/0077 701/31.7 |
| 4,451,770 A * | 5/1984 | Boettner | H02P 23/06 318/727 |
| 4,456,031 A * | 6/1984 | Taplin | F15B 9/03 137/625.62 |
| 4,999,552 A | 3/1991 | Seipelt | |

(Continued)

FOREIGN PATENT DOCUMENTS

| | | |
|---|---|---|
| CN | 104390776 | 3/2015 |
| CN | 105805086 | 7/2016 |

(Continued)

OTHER PUBLICATIONS

International Search Report and Written Opinion in International Application No. PCT/US2022/075374, dated Dec. 6, 2022, 13 pages.

*Primary Examiner* — Alessandro V Amari
*Assistant Examiner* — Sharah Zaab
(74) *Attorney, Agent, or Firm* — Fish & Richardson P.C.

(57) ABSTRACT

The subject matter of this specification can be embodied in, among other things, a torque motor monitoring system that includes a first observer module configured to receive a first collection of operational information about a torque motor when the torque motor is operating normally, and determine a duty offset ratio value based on the first collection of operational information, a second observer module configured to receive a second collection of operational information about a torque motor, determine a MOSFET gate duty ratio value based on the second collection of operational information and the duty offset ratio value, and determine a motor current value, and a fault detection module configured to identify a fault in the torque motor based on the MOSFET gate duty ratio value, the motor current value, and a predetermined fault determination threshold value.

17 Claims, 5 Drawing Sheets

(56) References Cited

U.S. PATENT DOCUMENTS

| | | |
|---|---|---|
| 5,274,554 A | 12/1993 | Takats et al. |
| 5,319,296 A | 6/1994 | Patel |
| 5,486,997 A * | 1/1996 | Reismiller ......... G05B 19/4062 |
| | | 700/45 |
| 6,700,345 B2 | 3/2004 | Wilkens |
| 6,766,230 B1 | 7/2004 | Rizzoni et al. |
| 7,308,385 B2 | 12/2007 | Wegerich et al. |
| 7,567,862 B2 * | 7/2009 | Pelton ................ B64D 45/0005 |
| | | 701/9 |
| 7,970,583 B2 | 6/2011 | Novis et al. |
| 8,060,340 B2 | 11/2011 | Gao et al. |
| 8,583,294 B2 | 11/2013 | Villano et al. |
| 9,273,613 B2 | 3/2016 | Aurousseau et al. |
| 9,595,958 B1 * | 3/2017 | Nakano .............. H03K 17/0822 |
| 9,709,979 B2 * | 7/2017 | Guillory ............. H02P 29/0241 |
| 10,023,303 B2 | 7/2018 | Moutaux et al. |
| 10,114,386 B2 | 10/2018 | Summers et al. |
| 2003/0090228 A1 | 5/2003 | Wilkens |
| 2008/0067960 A1 * | 3/2008 | Maeda .................. B62D 5/046 |
| | | 180/443 |
| 2008/0294311 A1 | 11/2008 | Henson |
| 2009/0039869 A1 * | 2/2009 | Williams ............... H01L 24/48 |
| | | 324/123 R |
| 2017/0152022 A1 | 6/2017 | Moutaux et al. |
| 2019/0074682 A1 | 3/2019 | Suda et al. |

FOREIGN PATENT DOCUMENTS

| | | | | |
|---|---|---|---|---|
| CN | 109669429 | * | 4/2019 | ............ G05B 23/02 |
| DE | 3129313 | | 5/1982 | |
| EP | 0093348 | | 11/1983 | |
| EP | 1061269 | | 12/2000 | |
| EP | 3081480 | | 10/2016 | |
| GB | 2404100 | | 1/2005 | |
| JP | H05185937 | * | 7/1993 | ............... B62D 5/04 |
| WO | WO 2020032084 | | 2/2020 | |

* cited by examiner

MODEL BASED MONITORING OF FAULTS IN ELECTRO-HYDRAULIC VALVES

TECHNICAL FIELD

This instant specification relates to electrical motor fault detection.

BACKGROUND

Electro-hydraulic servo valves (EHSVs) use a torque motor to regulate flow in hydraulic circuits. The torque motor armature drives a proportional spool valve, and in turn receives force feedback from the valve through a spring. The force feedback ensures that the flow out of the valve can be made proportional to the current through the torque motor coil. As such, the task of controlling flow then becomes a current control problem. EHSVs are used in many parts of an aircraft engine control system, including fuel controls and propeller blade angle control.

The torque motor current control loop contains many different components, including the software, the driver circuitry, the wiring, and the torque motor itself. Each component has different failure modes. To meet the system reliability requirements one creates multiple channels of control, each channel having the same circuitry duplicated. If a failure is detected in one channel, then control is switched from the failed channel to the healthy channel. For adequate system reliability, it is important to detect as many failure modes as possible, in order to prevent the system from using hardware that has a fault.

In a torque motor control loop, there are some failures that have not been possible to detect using conventional hardware or software based methods. These include the detection of partial open circuits, and partial short circuits, and the detection of open and short circuits at very low control currents, such as less than 20 mA.

SUMMARY

In general, this document describes systems and techniques for detecting faults in electrical motors, including electro-hydraulic valves.

In a general implementation, a computer-implemented method for monitoring a torque motor includes determining a MOSFET gate duty ratio value, determining a motor current value, determining a fault determination value as a ratio of the MOSFET gate duty ratio value to the motor current value, and identifying a fault in the torque motor based on the fault determination value.

Various implementations can include some, all, or none of the following features. The motor current value can be based on a torque motor winding current value and a predetermined maximum current value. The MOSFET gate duty ratio value can be based on a predetermined duty ratio offset value and a proportional-integral output value. The proportional-integral output value can be based on a normalized current error and an integral of the normalized current error. The normalized current error can be based on a maximum voltage supply current value, an estimated torque motor current value, and a predetermined current command value. The computer-implemented method can include determining a torque motor resistance value based on a nominal resistance value, a gain value, a torque motor current value, a disturbance voltage value, and a duty ratio offset value. The computer-implemented method can include determining a torque motor current value based on a measured winding current value of the torque motor, determining an integral of a normalized current error value, determining stabilization of torque motor current value and the integral of the normalized current error value, and determining a stabilized duty offset ratio value as a predetermined duty offset ratio value. Identifying a fault in the torque motor based on the fault determination value can include one or more of determining that the fault determination value is greater than or equal to a first predetermined threshold value representative of a high resistance fault, determining that the fault determination value is less than a second predetermined threshold value representative of a low resistance fault, or determining no fault based on determining that the fault determination value is less than the first predetermined threshold value and greater than or equal to the second predetermined threshold value.

In an example embodiment, a torque motor monitoring system includes a first observer module configured to receive a first collection of operational information about a torque motor when the torque motor is operating normally, and determine a duty offset ratio value based on the first collection of operational information, a second observer module configured to receive a second collection of operational information about a torque motor, determine a MOSFET gate duty ratio value based on the second collection of operational information and the duty offset ratio value, and determine a motor current value, and a fault detection module configured to identify a fault in the torque motor based on the MOSFET gate duty ratio value, the motor current value, and a predetermined fault determination threshold value.

Various embodiments can include some, all, or none of the following features. The second observer module can be further configured to determine an absolute torque motor resistance value. The motor current value can be based on a torque motor winding current value and a predetermined maximum current value. The MOSFET gate duty ratio value can be based on the duty offset ratio value and a proportional-integral output value. The proportional-integral output value is based on a normalized current error and an integral of the normalized current error. The normalized current error can be based on a maximum voltage supply current value, an estimated current value, and a predetermined current command value. The torque motor monitoring system can include determining a torque motor resistance value based on a nominal resistance value, a gain value, a current value, a disturbance voltage value, and the duty offset ratio value. The first observer module can be configured to determine a current value based on a measured winding current value of the torque motor, determine an integral of a normalized current error value, determine stabilization of the current value and the integral of the normalized current error value, and determine a stabilized duty offset ratio value as a predetermined duty offset ratio value. Identifying a fault in the torque motor based on the MOSFET gate duty ratio value, the motor current value, and the predetermined fault determination threshold value can include one or more of determining that the predetermined fault determination threshold value is greater than or equal to a first predetermined threshold value representative of a high resistance fault, determining that the predetermined fault determination threshold value is less than a second predetermined threshold value representative of a low resistance fault, and determining no fault based on determining that the predetermined fault determination threshold value is less than the first predetermined threshold value and greater than or equal to the second predetermined threshold value.

The systems and techniques described here may provide one or more of the following advantages. First, a system can provide monitoring and feedback with regard to the performance of electric motors. Second, the system can provide ongoing information about the health and performance of electric motors over time. Third, the system can create a baseline measurement of a motor's health and performance as a point of reference for subsequent measurements. Fourth, by comparing a motor's performance against its own baseline performance, the system can provide improved monitoring and feedback of motor health. Fifth, the system can improve the safety and reliability of systems controlled by monitored electric motors.

The details of one or more implementations are set forth in the accompanying drawings and the description below. Other features and advantages will be apparent from the description and drawings, and from the claims.

DETAILED DESCRIPTION

This document describes systems and techniques for detecting faults in electrical motors, including electro-hydraulic valves. In general, the closed feedback loop that is used to control the motor can be observed at two different points in time, and those two observations can be compared to determine if a fault has developed in the time in-between. Generally speaking, at a first point in time (e.g., early in the lifespan of the motor and/or under known-favorable operational conditions), a predicted and measured behavior of a motor is compared to determine a baseline error value. Later, a similar comparison is made to determine an updated error value. If the updated value remains close to the baseline value, the system may determine that no fault is present. However, if the updated value has drifted too far from the baseline value, then the system may determine that a fault is present, and respond by alerting a user or another system to the possible fault.

Figure 1:
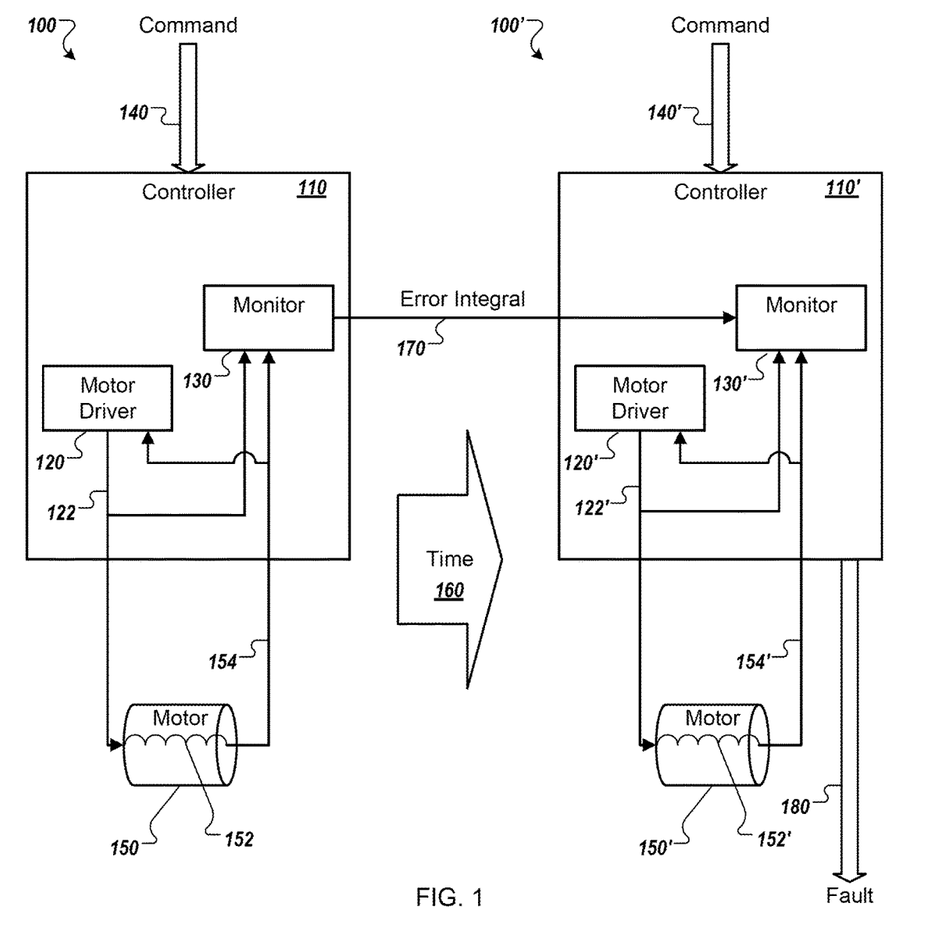
FIG. 1 is a block diagram that shows an example of a system for detecting faults in electrical motors.

FIG. 1 is a block diagram that shows an example of a system 100 for detecting faults in electrical motors. The system 100 includes a controller 110 that includes a motor driver module 120 (e.g., a MOSFET based driver) and a monitor module 130. The motor driver module 120 is configured to provide electrical power signals 122 to a motor coil 152 of an electrical motor 150 based on a command signal 140 (e.g., a position or speed setting from a user or another system).

The electrical motor 150 provides feedback signals 154 that can be received by the controller 110 for use in closed-loop feedback control of the electrical motor 150. The monitor module 130 compares the electrical power signals 122 to the feedback signals 154 to determine an error integral value 170 that is based on the resistance and/or impedance of the motor coil 152 (e.g., based on the resistance, inductance, and/or capacitance of the coil). This comparison will be described in more detail in the discussion of FIGS. 2-4.

FIG. 1 also shows a system 100', which represents the example system 100 at a later point in time, represented by arrow 160. The system 100' includes a controller 110', a motor driver module 120', a monitor module 130', and an electrical motor 150' having a motor coil 152', which all represent their corresponding components in the system 100 at the later point in time.

In use, the system 100' provides electrical power signals 122' to the motor coil 152' based on a command signal 140'. The electrical motor 150' provides feedback signals 154' that can be received by the controller 110' for use in closed-loop feedback control of the electrical motor 150'. The monitor module 130' compares the electrical power signals 122' to the feedback signals 154' to determine the resistance and/or impedance of the motor coil 152'. The resistance and/or impedance of the motor coil 152' and the error integral value 170 are used by the monitor module 130' to determine if the resistance of the motor coil 152' is different from the resistance of the motor coil 152. For example, a low resistance fault (e.g., a decrease in resistance of more than a predetermined amount over time 160) may indicate that an electrical short is developing or has developed in the motor coil 152'. In another example, a high resistance fault (e.g., an increase in resistance of more than a predetermined amount over time 160) may indicate that the motor coil 152' is failing toward an open circuit. This comparison will be described in more detail in the discussion of FIGS. 2-4.

If the difference in resistance exceeds a predetermined threshold, then the controller 110' provides a fault signal 180. In some embodiments, the fault signal 180 can trigger, directly or indirectly, a user interface device (e.g., an alarm, a visual indicator on a display device) to alert a user to the detected problem. In some embodiments, the fault signal 180 can be received by another system and used to trigger subsequent events (e.g., to trigger the transmission of an electronic message to a user, to add an entry to a maintenance scheduling system to put the electrical motor 150' on a schedule for inspections and/or service).

Figure 2:
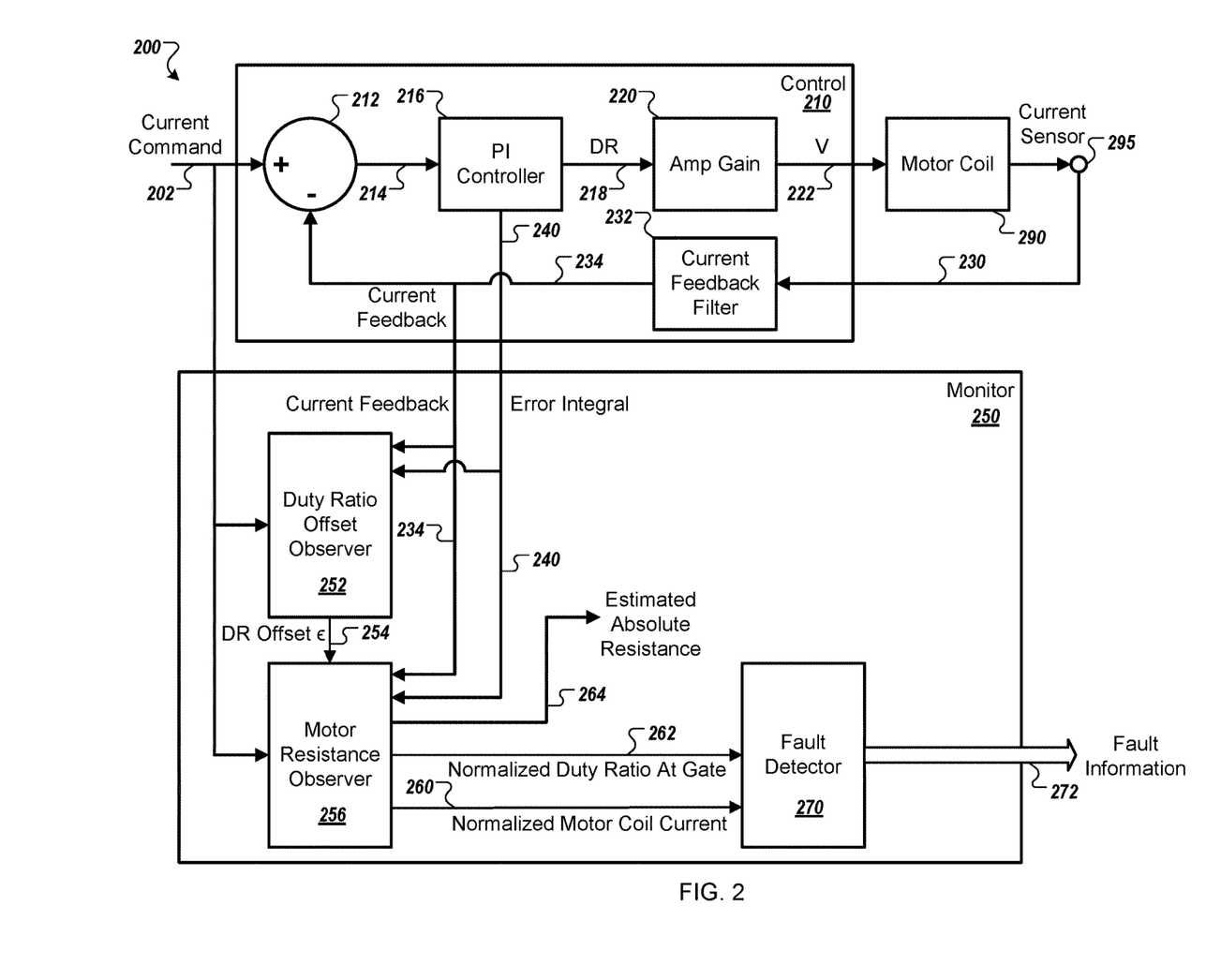
FIG. 2 is a schematic diagram that shows an example of a system for detecting faults in electrical motors.

FIG. 2 is a schematic diagram that shows an example of a system 200 for detecting faults in electrical motors. In some implementations, the system 200 can be part of the example systems 100 and 100' of FIG. 1.

The system 200 includes two main components, a control module 210 and a monitor module 250. The control module 210 is configured to perform a control loop to provide power to a motor coil 290 (e.g., the example motor coil 152 and/or 152' of FIG. 1). A current command signal 202 (e.g., a predetermined current command value) is received by the control module 210 at a summing node 212 that provides a summed current control signal 214. The summed current control signal 214 is received by a proportional-integral (PI) controller 216 that is configured to output a signal 218 having a MOSFET gate duty ratio value that is based on (e.g., proportional to) the summed current control signal 214. In some implementations, the PI controller 216 can be a proportional (P) controller or a proportional-integral-derivative (PID) controller. The PI controller 216 is also configured to determine an error integral value 240 (e.g., a proportional-integral output value).

The signal 218 is received by an amplifier 220, which is configured to output a voltage signal 222 that is based on (e.g., proportional to) the duty ratio of the signal 218. The amplifier 220 is a MOSFET-based pulse-width modulated (PWM) amplifier. The controller module 210 provides the voltage signal 222 to the motor coil 290 (e.g., to power a motor).

MOSFETs typically have inherent delays because MOSFETs have finite turn-on and turn-off times. For example, a typical MOSFET can have a turn on time ($T_{on}$) of about 22 nsec, and a turn off time ($T_{off}$) of about 2 usec. Assuming an arbitrary 1 millisecond PWM period, this implies that a "minimum" duty ratio command from the gate drive circuit of 0.022% may be needed to turn the MOSFET on. In this example, any duty ratio greater than 0.022% and less than 2% can cause an effective duty ratio of 2% due to the finite $T_{off}$. This behavior of the MOSFET can be modeled as an offset added to the duty ratio calculated by the PI controller 216. The offset does not vary substantially with the DC resistance of the motor coil 290 (e.g., as a function of temperature). The offset value is substantially the same at the various points of the impedance envelope of the motor coil 290, and can be used as a predetermined duty ratio offset value.

The motor coil 290 has an inherent amount of electrical resistance (R), and as suggested by Ohm's Law, the amount of current that flows through the motor coil 290 will be a ratio of the voltage signal 222 to the resistance of the motor coil 290. A current sensor 295 is configured to measure the current that passes through the motor coil 290 and provide a current measurement signal 230 indicative of a measured winding current value to the control module 210. The motor coil 290 has an inherent amount of capacitance, inductance, and/or resistance that can contribute to the overall impedance of the motor coil 290. The inherent amount of capacitance, inductance, and/or resistance of the motor coil 290 can be measured as feedback (e.g., by appropriate sensors and/or mathematical processing of feedback signals can estimate such properties).

The current measurement signal 230 is received by a current feedback filter 232, which filters the current measurement signal 230 to determine a current feedback signal 234. The current feedback signal 234 is provided as a negative input to the summing node 212 to close the control loop.

In general, the monitor module 250 is a torque motor monitoring system that monitors torque motor resistance by comparing a ratio of normalized duty ratio at the MOSFET gates of the amplifier 220 to a normalized current through the torque motor winding (e.g., a normalized torque motor winding current value). This is equivalent to the ratio of voltage across the motor coil 290 to the current through the motor coil 290, and this ratio is substantially the same as a resistance measurement. If there is no resistance change from a nominal value, then this ratio=1. If the resistance of the motor coil 290 increases, then this ratio becomes greater than 1; if the resistance of the motor coil 290 decreases, then this ratio becomes less than 1.

The duty ratio at the MOSFET gates of the amplifier 220 is determined based on a collection of operational information about the motor coil 290, such as the duty ratio at the output of the PI controller 216. The switch-off delay of the MOSFETs causes an unknown offset to be added to the output of the PI controller 216. The duty ratio appearing at the MOSFET gates is calculated by correcting the duty ratio computed by the PI controller 216 with the duty ratio offset. In the illustrated example, a duty ratio offset 254 (e.g., E) is determined using a first observer module 252 (e.g., a duty ratio offset observer module).

In general, the first observer module 252 is run when the resistance of the motor coil 290 is known to be at nominal, for example during start-up. The first observer module 252 is configured to estimate the duty ratio offset 254, a motor coil current, and an integral of the normalized current error. When the motor coil current is determined to have achieved stabilization, the first observer module 252 saves the duty ratio offset 254 to represent the MOSFET switch off delay. When the observer outputs are determined to have stabilized, the first observer module 252 saves the stabilized fault duty offset ratio value as the duty ratio offset 254 for later use. In some implementations, the duty ratio offset 254 can be determined experimentally instead of being calculated using the first observer module 252.

Mathematically, the dynamics of the current through the motor coil 290 can be modeled as:

$$L\frac{di}{dt} = -Ri + v = -Ri + K_a(\mu' + \epsilon)$$

Where v is the voltage applied across the motor coil 290, $K_a$ is a gain value of the amplifier 220, µ' is the duty ratio signal 218 determined by the PI controller 216, and E represents an unknown offset in the duty ratio due to MOSFET turn-off delays.

The dynamics of the current through the motor coil 290 can be rewritten as:

$$\frac{di}{dt} = \frac{K_a}{L}\epsilon + \frac{K_a}{L}\mu' - \frac{R}{L}i$$

With a constant offset in duty ratio:

$$\frac{d\epsilon}{dt} = 0$$

And the PI output duty ratio can be given as:

$$\mu' = K_p e + K_i \int e$$

Where:

$$e = \frac{1}{I_{max}}(i^* - i)$$

i* is a current demand (e.g., estimated torque motor current value), and Imax is the maximum voltage supply current value (e.g., a predetermined maximum current value).

For this derivation, state variables can be chosen where:
$x_1 = \epsilon$ is the duty ratio offset,
$x_2 = i$ is the current, and
$x_3 = \int e$ And the measured variables are current and integral of error:
u=i
$y_1$=i
$y_2 = \int e$ The state equations for the first observer module 252 are:
$\dot{x}_1 = 0$: an unknown but constant current, $$\dot{x}_2 = \frac{K_a}{L}x_1 - \left(\frac{R}{L} + \frac{K_a K_p}{L I_{max}}\right)x_2 +$$

-continued $$\frac{K_aK_i}{L}x_3 + \frac{K_aK_p}{LI_{max}}u\text{:dynamics of motor coil current,}$$

and $$\dot{x}_3 = -\frac{1}{I_{max}}x_2 + \frac{1}{I_{max}}u\text{:the current loop error.}$$

A second observer module 256 (e.g., a motor resistance observer) estimates a normalized motor coil current 260 and a normalized duty ratio 262 at the MOSFET gates assuming the duty ratio offset 254 is known, either through experimentation or by running the first observer module 252 (e.g., duty ratio offset observer module). The second observer module 256 is configured to estimate a disturbance voltage ($V_d$), a normalized current through the motor coil 290 ($i$), and an integral of the normalized current error.

The dynamics of the current through the motor coil 290 can be rewritten as:

$$L\frac{di}{dt} = -Ri + v = -R_{nom}i - V_d + K_a(\mu' + \epsilon)$$

Where $\mu'$ is the duty ratio 218 determined by the PI controller 216, $V_d$ is a disturbance voltage value due to a change in motor coil resistance, $R_{nom}$ is a nominal resistance value for the motor coil 290, and E is a known offset in duty ratio due to MOSFET turn-off delay.

The dynamics of the current through the motor coil 290 can be rewritten as:

$$\frac{di}{dt} = \frac{K_a}{L}\epsilon + \frac{K_a}{L}\mu' - \frac{R_{nom}}{L}i - \frac{V_d}{L}$$

The disturbance voltage can be given as:

$$\frac{dV_d}{dt} = 0$$

The second observer module 256 calculates the PI output duty ratio as:

$$\mu'=K_pe+K_i\int e$$

$$e = \frac{1}{I_{max}}(i^* - i).$$

Where
The duty ratio at the MOSFET gates is determined as:

$$\mu=\mu'+\epsilon$$

And the motor coil resistance can be given as:

$$R = R_{nom} + \frac{(V_d + Ka\epsilon)}{i}$$

For this derivation, state variables can be chosen where:
$x_1=V_d$ is the duty ratio offset,
$x_2=i$ is the current, and
$x_3=\int e$ is a normalized current error value.

And the measured variables are current and integral of error:
u=i
$y_i$=i
$y_2=\int e$ The state equations for the second observer module 256 are:
$\dot{x}_1$=0: an unknown but constant disturbance voltage (e.g., the change in resistance from the nominal can be calculated by correcting for the duty ratio offset and then by dividing this by the estimated current), $$\dot{x}_2 = \frac{K_a}{L}x_1 - \left(\frac{R_{nom}}{L} + \frac{K_aK_p}{LI_{max}}\right)x_2 +$$

$$\frac{K_aK_i}{L}x_3 + \frac{K_aK_p}{LI_{max}}u\text{:dynamics of motor coil current,}$$

and $$\dot{x}_3 = -\frac{1}{I_{max}}x_2 + \frac{1}{I_{max}}u\text{:the current loop error.}$$

The second observer module 256 can also be configured to determine an absolute motor coil resistance 264 of the motor coil 290. The change in resistance estimated by the second observer module 256 can be summed with the nominal resistance to obtain the resistance estimate. In some implementations, the resistance estimate can be used for monitoring temperature variations in DC resistance that may not constitute a fault.

The second observer module 256 calculates the absolute motor coil resistance 264 (an absolute torque motor resistance value) as:

$$R = R_{nom} + \frac{(V_d + Ka\epsilon)}{i}$$

A fault detection module 270 calculates a ratio of normalized duty ratio (p) to a normalized motor current value (e.g., i/Imax). This ratio is used as a fault determination value. If the calculated ratio is not equal to 1, then a fault is detected. The ratio of normalized duty ratio to normalized current is calculated as:

$$\text{Ratio} = \frac{\mu}{\frac{i}{I_{max}}}$$

In some implementations, persistence can be implemented on the ratio by monitoring it over a predetermined period of time (e.g., a moving average, a stabilized fault duty offset ratio value). The fault detection module 270 is configured to compare the ratio (or the persisted ratio) to one or more predetermined threshold values representative of resistance faults, and respond by providing a fault information signal 272 that indicates the presence and/or nature of detected faults. In some implementations, the fault information signal 272 can be configured to directly alert users (e.g., operators, maintenance personnel) to a fault, for example by illuminating a warning light or sounding an audible alarm.

In some implementations, the fault information signal 272 can be configured to notify other systems of the fault (e.g., a dashboard controller, a central operations management system, a maintenance database server, a system configured to send electronic messages to users).

In general, a ratio of 1 (one) can suggest that there is no fault present. In some implementations, a ratio of greater than 1 can indicate an increased resistance in the motor coil 290. For example, if the ratio is greater than or equal to a predetermined fault determination threshold value of about 1.2, then the fault detection module 270 may determine that a partial open circuit fault may exist in the motor coil 290. In some implementations, a ratio of less than 1 can indicate a decreased resistance in the motor coil 290. For example, if the ratio is less than a predetermined fault determination threshold value of about 0.8, then the fault detection module 270 may determine that a partial short circuit fault may exist in the motor coil 290.

The principle of using observers to monitor resistance can be extended to monitoring other faults by using a more complex model of the motor coil 290 to include mechanical dynamics of connected loads. For example, the model can be extended to include characteristics of an electrohydraulic servo valve assembly configured to be driven by the motor coil 290.

Figure 3:
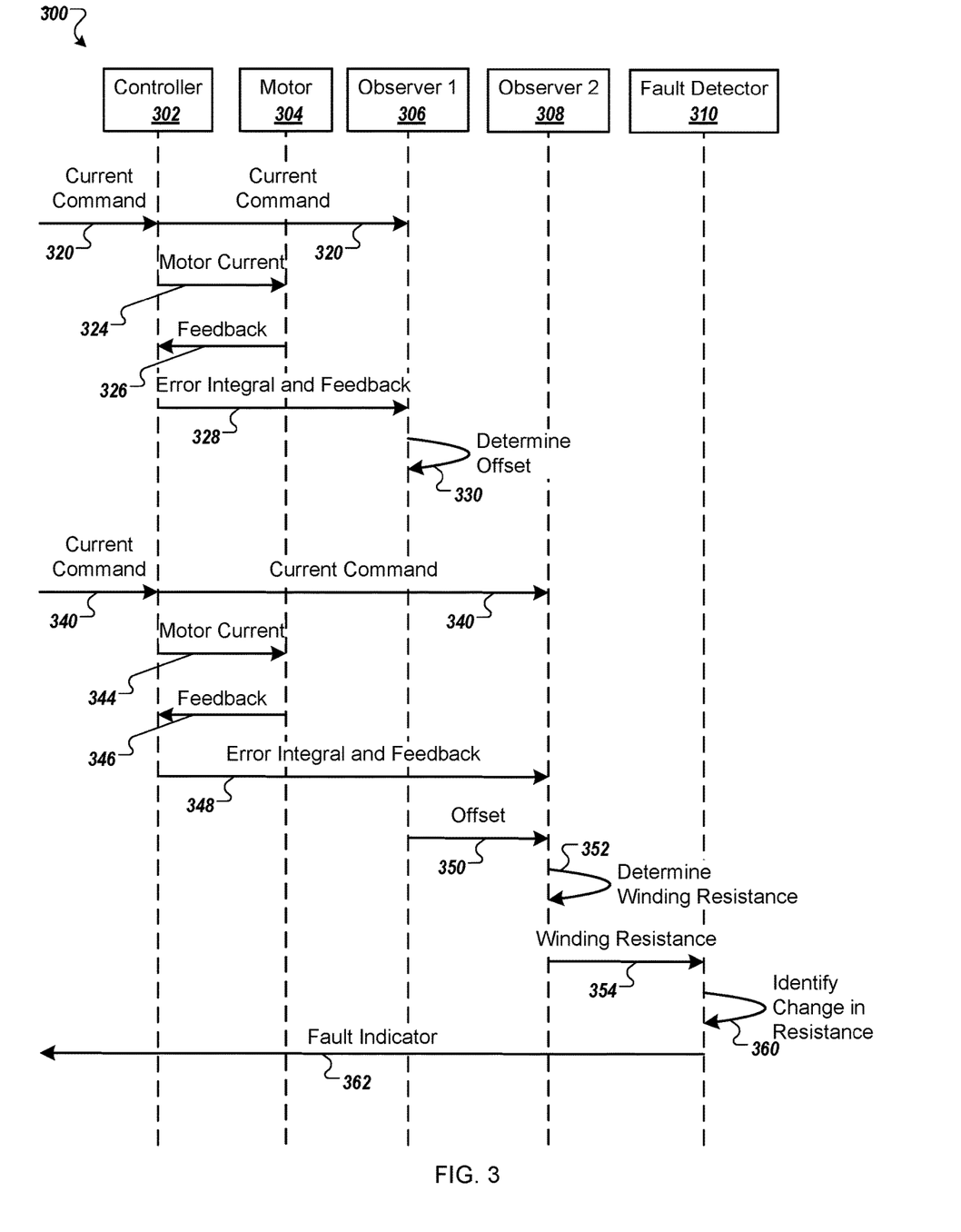
FIG. 3 is a swim lane diagram that shown an example process for detecting faults in electrical motors.

FIG. 3 is a swim lane diagram that shown an example process 300 for detecting faults in electrical motors. The process 300 may be performed, for example, by a system such as the example system 100 of FIG. 1, or the example system 200 of FIG. 2. For clarity of presentation, the description that follows uses the systems 100 and 200 as examples for describing the process 300. However, another system, or combination of systems, may be used to perform the process 300.

In the illustrated example, a controller 302 (e.g., the example controller module 210 of FIG. 2) receives a current command 320 for use in controlling a motor 304 (e.g., a motor having the example motor coil 290). An observer module 306 (e.g., the example first observer module 252) also receives the current command 320.

The controller 302 provides motor current 324 to the motor 304 based on the current command 320. A feedback signal 326 is sent from the motor 304 to the controller 302 based on the actual current that passes through the coils of the motor 304. The controller 302 determines an error integral value 328 based on the current command 320 and the feedback signal 326.

The controller 302 provides the error integral and current feedback values 328 to the observer module 306. The observer module 306 determines an offset value 330 based on the current command 320 and the values 328. The offset value 330 is descriptive of the duty ratio offset of the PWM signal generated by the controller 302 to control the motor 304. The offset value 330 is stored for later use.

In some implementations, the steps of the process 300 up to this point can be done under circumstances in which the motor 304 is in a known-good condition. For example, the preceding steps may be performed at motor startup, or when the motor 304 is new. In some implementations, the steps that follow may be performed at a different, later time (e.g., hours, days, weeks, months, or years later), for example, to determine if a fault has developed within the motor 304 during that time. In some implementations, the steps that follow may be performed more than once (e.g., on demand, each time an engine is operated, periodically during operation or flight).

In the illustrated example, a controller 302 receives a current command 340 for use in controlling the motor 304. An observer module 308 (e.g., the example second observer module 256) also receives the current command 340.

The controller 302 provides motor current 344 to the motor 304 based on the current command 340. A feedback signal 346 is sent from the motor 304 to the controller 302 based on the actual current that passes through the coils of the motor 304. The controller 302 determines an error integral value 348 based on the current command 340 and the feedback signal 346.

The controller 302 provides the error integral and current feedback values 348 to the observer module 308. The observer module 308 receives the stored offset value 330 from the observer module 306 as an offset value 350. The observer module 308 determines a winding resistance 352 based on the current command 340, the offset value 350, and the values 348. The observer module 308 provides the winding resistance to a fault detection module 310 (e.g., the example fault detection module 270) as a winding resistance value 354.

The fault detection module 310 compares the winding resistance value against one or more thresholds, and identifies 360 a change in resistance (e.g., increased resistance can indicate that a coil of the motor 304 may be failing toward open circuit, decreased resistance can indicate that a coil of the motor 304 may be failing toward a short circuit). If a change in resistance exceeds the predetermined threshold(s), then the fault detection module 310 provides a fault indicator signal 362. In some implementations, the fault indicator signal 362 can be a signal that is directly perceptible to human operators (e.g., a light or alarm that indicates the fault). In some implementations, the fault indicator signal 362 can be a signal that triggers another system into action (e.g., to schedule an inspection of the motor 304, to send an electronic message to alert an operator to the fault).

Figure 4:
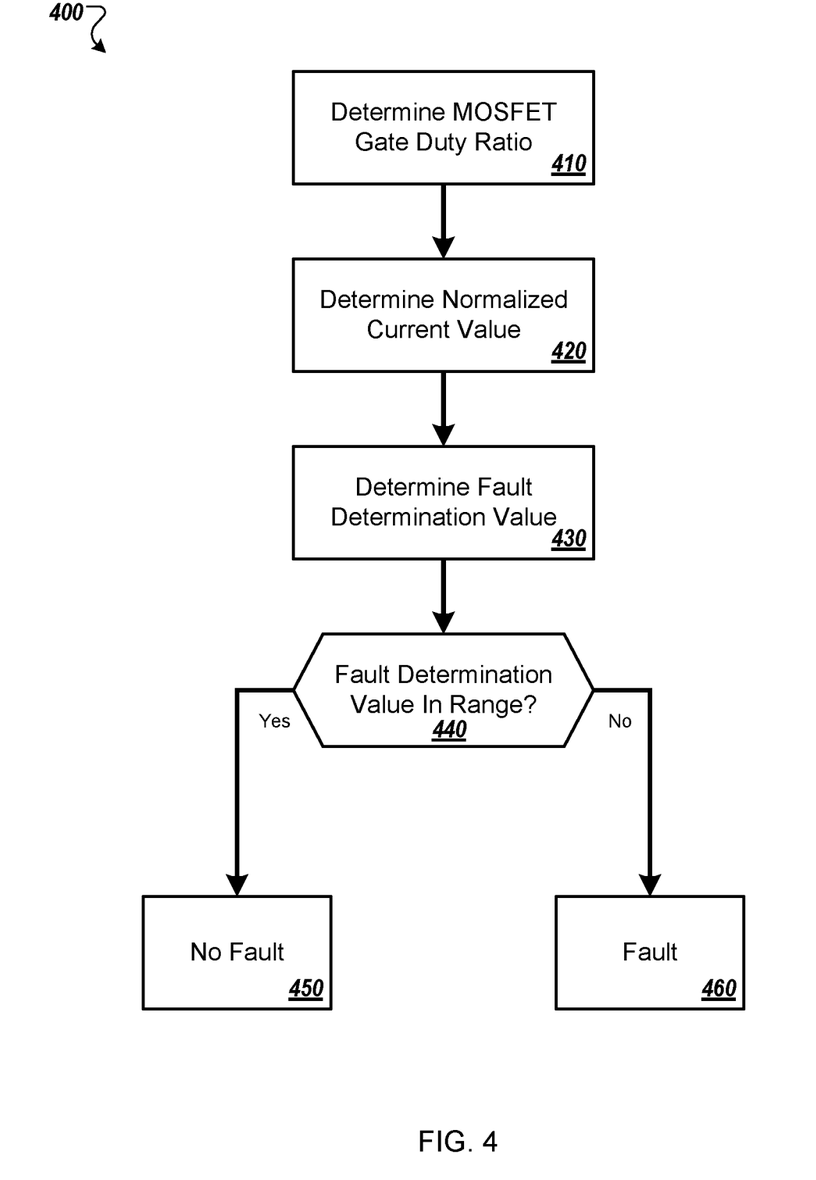
FIG. 4 is flow chart that shows an example of a process for detecting faults in electrical motors.

FIG. 4 is flow chart that shows an example of a process 400 for detecting faults in electrical motors. The process 400 may be performed, for example, by a system such as the example system 100 of FIG. 1 or the example system 200 of FIG. 2. For clarity of presentation, the description that follows uses the systems 100 and 200 as examples for describing the process 400. However, another system, or combination of systems, may be used to perform the process 400.

At 410 the MOSFET gate duty ratio is determined. For example, the PI controller 216 can determine a MOSFET gate duty ratio value that is based on (e.g., proportional to) the summed current control signal 214.

At 420, a normalized motor current value is determined. For example, second observer module 256 can determine the normalized motor coil current 260. In some implementations, the normalized motor current value can be based on a torque motor winding current value and a predetermined maximum current value. For example, the value can be given as $$\frac{i}{I_{max}}.$$

At 430, a fault determination value is determined as a ratio of the MOSFET gate duty ratio value to the normalized motor current value. For example, the second observer module 256 can determine the normalized duty ratio 262 at the MOSFET gate, and the fault detection module 270 can determine a ratio of the normalized motor coil current 260 and the normalized duty ratio at the MOSFET gate 262 as a fault determination value.

In some implementations, the MOSFET gate duty ratio value can be based on a predetermined duty ratio offset value and a proportional-integral output value. For example, the value can be given as: $\mu=\mu'+\epsilon$. In some implementations, the proportional-integral output value can be based on a normalized current error and an integral of the normalized current error. For example, the value can be given as $\mu'=K_p e+K_i\int e$. In some implementations, the normalized current error can be based on a maximum voltage supply current value, an estimated torque motor current value, and a predetermined current command value. For example, the controller module 210 can operate based on the current command signal 202.

At 440, a fault in the torque motor is identified based on the fault determination value. For example, the fault detection module 270 can compare the determined ratio against one or more predetermined threshold values above (e.g., high resistance, open circuit) and/or below (e.g., low resistance, short circuit) a ratio value of 1 (e.g., nominal resistance). In some implementations, identifying a fault in the torque motor based on the fault determination value can include one or more of determining that the fault determination value is greater than or equal to a first predetermined threshold value (e.g., about 1.2) representative of a high resistance fault, determining that the fault determination value is less than a second predetermined threshold value (e.g., 0.8) representative of a low resistance fault, or determining no fault based on determining that the fault determination value is less than the first predetermined threshold value and greater than or equal to the second predetermined threshold value (e.g., about 1).

In some implementations, the process 400 can include determining a torque motor resistance value based on a nominal resistance value, a gain value, a torque motor current value, a disturbance voltage value, and a duty ratio offset value. For example, motor coil resistance can be given as $$R = R_{nom} + \frac{(V_d + Ka\epsilon)}{i}.$$

In some implementations, the process 400 can include determining a torque motor current value based on a measured winding current value of the torque motor, determining an integral of a normalized current error value, determining stabilization of torque motor current value and the integral of the normalized current error value, and determining a stabilized fault duty offset ratio value as a predetermined fault duty offset ratio value. For example, epsilon ($\epsilon$) can be determined experimentally, or by using the first observer module. In experiments, a small (e.g., minimum) duty ratio can be applied to the MOSFETS to turn them on, and then the current in the motor coil can be measured at the applied turn-on duty ratio. The measured current can be divided by the threshold (e.g., maximum possible) current given the voltage supply and the torque motor winding resistance to determine the duty ratio offset value or "$\epsilon$".

Figure 5:
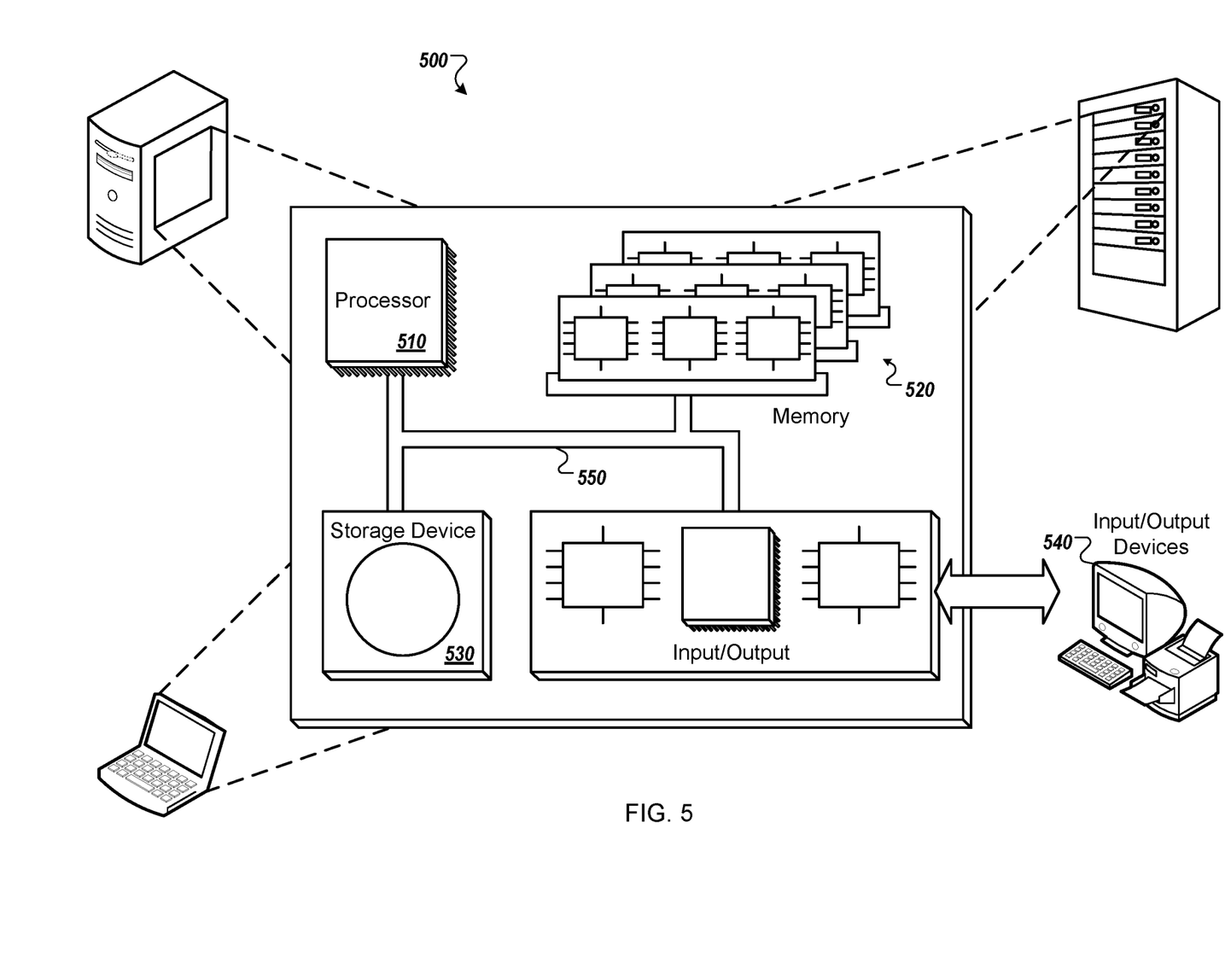
FIG. 5 is a schematic diagram of an example of a generic computer system.

FIG. 5 is a schematic diagram of an example of a generic computer system 500. The system 500 can be used for the operations described in association with the example processes 300 and/or 400 according to an example implementation. For example, the system 500 may be included in either or all of the example system 100, the example system 100', and the example system 200.

The system 500 includes a processor 510, a memory 520, a storage device 530, and an input/output device 540. Each of the components 510, 520, 530, and 540 are interconnected using a system bus 550. The processor 510 is capable of processing instructions for execution within the system 500. In one implementation, the processor 510 is a single-threaded processor. In another implementation, the processor 510 is a multi-threaded processor. The processor 510 is capable of processing instructions stored in the memory 520 or on the storage device 530 to display graphical information for a user interface on the input/output device 540.

The memory 520 stores information within the system 500. In one implementation, the memory 520 is a computer-readable medium. In one implementation, the memory 520 is a volatile memory unit. In another implementation, the memory 520 is a non-volatile memory unit.

The storage device 530 is capable of providing mass storage for the system 500. In one implementation, the storage device 530 is a computer-readable medium. In various different implementations, the storage device 530 may be a floppy disk device, a hard disk device, an optical disk device, or a tape device.

The input/output device 540 provides input/output operations for the system 500. In one implementation, the input/output device 540 includes a keyboard and/or pointing device. In another implementation, the input/output device 540 includes a display unit for displaying graphical user interfaces.

The features described can be implemented in digital electronic circuitry, or in computer hardware, firmware, software, or in combinations of them. The apparatus can be implemented in a computer program product tangibly embodied in an information carrier, e.g., in a machine-readable storage device for execution by a programmable processor; and method steps can be performed by a programmable processor executing a program of instructions to perform functions of the described implementations by operating on input data and generating output. The described features can be implemented advantageously in one or more computer programs that are executable on a programmable system including at least one programmable processor coupled to receive data and instructions from, and to transmit data and instructions to, a data storage system, at least one input device, and at least one output device. A computer program is a set of instructions that can be used, directly or indirectly, in a computer to perform a certain activity or bring about a certain result. A computer program can be written in any form of programming language, including compiled or interpreted languages, and it can be deployed in any form, including as a stand-alone program or as a module, component, subroutine, or other unit suitable for use in a computing environment.

Suitable processors for the execution of a program of instructions include, by way of example, both general and special purpose microprocessors, and the sole processor or one of multiple processors of any kind of computer. Generally, a processor will receive instructions and data from a read-only memory or a random access memory or both. The essential elements of a computer are a processor for executing instructions and one or more memories for storing instructions and data. Generally, a computer will also include, or be operatively coupled to communicate with, one or more mass storage devices for storing data files; such devices include magnetic disks, such as internal hard disks and removable disks; magneto-optical disks; and optical disks. Storage devices suitable for tangibly embodying computer program instructions and data include all forms of non-volatile memory, including by way of example semiconductor memory devices, such as EPROM, EEPROM, and flash memory devices; magnetic disks such as internal hard disks and removable disks; magneto-optical disks; and CD-ROM and DVD-ROM disks. The processor and the memory can be supplemented by, or incorporated in, ASICs (application-specific integrated circuits).

To provide for interaction with a user, the features can be implemented on a computer having a display device such as a CRT (cathode ray tube) or LCD (liquid crystal display) monitor for displaying information to the user and a keyboard and a pointing device such as a mouse or a trackball by which the user can provide input to the computer.

The features can be implemented in a computer system that includes a back-end component, such as a data server, or that includes a middleware component, such as an application server or an Internet server, or that includes a front-end component, such as a client computer having a graphical user interface or an Internet browser, or any combination of them. The components of the system can be connected by any form or medium of digital data communication such as a communication network. Examples of communication networks include, e.g., a LAN, a WAN, and the computers and networks forming the Internet.

The computer system can include clients and servers. A client and server are generally remote from each other and typically interact through a network, such as the described one. The relationship of client and server arises by virtue of computer programs running on the respective computers and having a client-server relationship to each other.

Although a few implementations have been described in detail above, other modifications are possible. For example, the logic flows depicted in the figures do not require the particular order shown, or sequential order, to achieve desirable results. In addition, other steps may be provided, or steps may be eliminated, from the described flows, and other components may be added to, or removed from, the described systems. Accordingly, other implementations are within the scope of the following claims.

What is claimed is:

1. A computer-implemented method for monitoring a torque motor, comprising:
   determining a MOSFET gate duty ratio value;
   determining a motor current value;
   determining a fault determination value as a ratio of the MOSFET gate duty ratio value to the motor current value; and
   identifying a fault in the torque motor based on the fault determination value.

2. The computer-implemented method of claim 1, wherein the motor current value is based on a torque motor winding current value and a predetermined maximum current value.

3. The computer-implemented method of claim 1, wherein the MOSFET gate duty ratio value is based on a predetermined duty ratio offset value and a proportional-integral output value.

4. The computer-implemented method of claim 3, wherein the proportional-integral output value is based on a normalized current error and an integral of the normalized current error.

5. The computer-implemented method of claim 4, wherein the normalized current error is based on a maximum voltage supply current value, an estimated torque motor current value, and a predetermined current command value.

6. The computer-implemented method of claim 1, further comprising determining a torque motor resistance value based on a nominal resistance value, a gain value, a torque motor current value, a disturbance voltage value, and a duty ratio offset value.

7. The computer-implemented method of claim 1, further comprising:
   determining a torque motor current value based on a measured winding current value of the torque motor;
   determining an integral of a normalized current error value;
   determining stabilization of torque motor current value and the integral of the normalized current error value; and
   determining a stabilized duty offset ratio value as a predetermined duty offset ratio value.

8. The computer-implemented method of claim 1, wherein identifying a fault in the torque motor based on the fault determination value comprises one or more of:
   determining that the fault determination value is greater than or equal to a first predetermined threshold value representative of a high resistance fault;
   determining that the fault determination value is less than a second predetermined threshold value representative of a low resistance fault; or
   determining no fault based on determining that the fault determination value is less than the first predetermined threshold value and greater than or equal to the second predetermined threshold value.

9. A torque motor monitoring system comprising:
   a first observer module configured to:
      receive a first collection of operational information about a torque motor when the torque motor is operating normally; and
      determine a duty offset ratio value based on the first collection of operational information;
   a second observer module configured to:
      receive a second collection of operational information about a torque motor;
      determine a MOSFET gate duty ratio value based on the second collection of operational information and the duty offset ratio value; and
      determine a motor current value; and
   a fault detection module configured to identify a fault in the torque motor based on the MOSFET gate duty ratio value, the motor current value, and a predetermined fault determination threshold value.

10. The torque motor monitoring system of claim 9, wherein the second observer module is further configured to determine an absolute torque motor resistance value.

11. The torque motor monitoring system of claim 9, wherein the motor current value is based on a torque motor winding current value and a predetermined maximum current value.

12. The torque motor monitoring system of claim 9, wherein the MOSFET gate duty ratio value is based on the duty offset ratio value and a proportional-integral output value.

13. The torque motor monitoring system of claim 12, wherein the proportional-integral output value is based on a normalized current error and an integral of the normalized current error.

14. The torque motor monitoring system of claim 13, wherein the normalized current error is based on a maximum voltage supply current value, an estimated current value, and a predetermined current command value.

15. The torque motor monitoring system of claim 9, further comprising determining a torque motor resistance value based on a nominal resistance value, a gain value, a current value, a disturbance voltage value, and the duty offset ratio value.

16. The torque motor monitoring system of claim 9, wherein the first observer module is configured to:
- determine a current value based on a measured winding current value of the torque motor;
- determine an integral of a normalized current error value;
- determine stabilization of the current value and the integral of the normalized current error value; and
- determine a stabilized duty offset ratio value as a predetermined duty offset ratio value.

17. The torque motor monitoring system of claim 9, wherein identifying a fault in the torque motor based on the MOSFET gate duty ratio value, the motor current value, and the predetermined fault determination threshold value comprises one or more of:
- determining that the predetermined fault determination threshold value is greater than or equal to a first predetermined threshold value representative of a high resistance fault;
- determining that the predetermined fault determination threshold value is less than a second predetermined threshold value representative of a low resistance fault; and
- determining no fault based on determining that the predetermined fault determination threshold value is less than the first predetermined threshold value and greater than or equal to the second predetermined threshold value.

* * * * *